(12) United States Patent
Nakaya

(10) Patent No.: US 7,902,078 B2
(45) Date of Patent: Mar. 8, 2011

(54) PROCESSING METHOD AND PLASMA ETCHING METHOD

(75) Inventor: Michiko Nakaya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 302 days.

(21) Appl. No.: 11/674,764

(22) Filed: Feb. 14, 2007

(65) Prior Publication Data

US 2007/0197041 A1     Aug. 23, 2007

Related U.S. Application Data

(60) Provisional application No. 60/776,925, filed on Feb. 28, 2006.

(30) Foreign Application Priority Data

Feb. 17, 2006  (JP) .................................. 2006-040536

(51) Int. Cl.
  *H01L 21/302*  (2006.01)
  *H01L 21/461*  (2006.01)

(52) U.S. Cl. .. 438/710; 438/717; 438/719; 257/E21.218; 257/E21.231

(58) Field of Classification Search .................. 438/717, 438/723
  See application file for complete search history.

(56) References Cited

U.S. PATENT DOCUMENTS

| | | | | |
|---|---|---|---|---|
| 5,382,316 A | * | 1/1995 | Hills et al. | ........................ 216/67 |
| 5,998,100 A | * | 12/1999 | Azuma et al. | ................... 430/313 |
| 6,074,927 A | * | 6/2000 | Kepler et al. | .................. 438/400 |
| 6,291,315 B1 | | 9/2001 | Nakayama et al. | |
| 6,376,384 B1 | * | 4/2002 | Yen et al. | ....................... 438/706 |
| 2004/0097090 A1 | | 5/2004 | Mimura et al. | |
| 2004/0127055 A1 | * | 7/2004 | Lee | ............................... 438/724 |
| 2004/0132307 A1 | * | 7/2004 | Lee | ............................... 438/691 |
| 2004/0222190 A1 | * | 11/2004 | Horiguchi et al. | .............. 216/79 |
| 2005/0106888 A1 | * | 5/2005 | Chiu et al. | ..................... 438/710 |

FOREIGN PATENT DOCUMENTS

| | | | |
|---|---|---|---|
| JP | 10-083986 | | 3/1998 |
| JP | 11135489 A | * | 5/1999 |
| JP | 11-243080 | | 9/1999 |
| JP | 2004-259819 | | 9/2004 |

OTHER PUBLICATIONS

Deshmukh et al. "Soft Silicon Etch Using Microwave Downstream Plasma for removal of Plasma Etch Induced Damage" 2nd International Symposium on plasma Process-induced Damage, May 13-14, 1997.*
Japanese Office Action dated Nov. 30, 2010 with English translation.

* cited by examiner

*Primary Examiner* — Matthew S Smith
*Assistant Examiner* — Shaka Scarlett
(74) *Attorney, Agent, or Firm* — Oblon, Spivak, McClelland, Maier & Neustadt, L.L.P.

(57) ABSTRACT

A processing method includes a silicon oxide etching process of performing a plasma etching on a target layer mainly made up of silicon, a silicon oxide layer formed on the target layer and a target object having a previously patterned resist layer formed on the silicon oxide layer, the plasma etching of the silicon oxide layer being performed by using the resist layer as a mask; a deposits removing process of removing deposits generated in the silicon oxide etching process and stuck to the target object; and a silicon etching process of performing a plasma etching on the target layer by a plasma generated from a processing gas containing $SF_6$, $O_2$ and $SiF_4$ while using the silicon oxide layer as a mask.

12 Claims, 11 Drawing Sheets

PROCESSING METHOD AND PLASMA ETCHING METHOD

FIELD OF THE INVENTION

The present invention relates to a processing method and a plasma etching method; and, more particularly, to a processing method including an etching process for etching a target object to be processed by using a plasma and a plasma etching method.

BACKGROUND OF THE INVENTION

In a manufacturing process of a semiconductor device, etching is performed on a silicon substrate to form, for example, trenches for device isolation or capacitors. For instance, in the course of forming trenches for DTI (Deep Trench Isolation) or trenches for memory cells and capacitors, a silicon etching is performed to form grooves or holes of high aspect ratios with opening diameters ranging from about 0.8 to about 1.2 μm and depths ranging from about 5 to about 8 μm on a Si substrate. Further, in fabricating a 3-dimensional package device or a MEMS (Micro Electro Mechanical System), an etching is performed to form through holes for interconnection or grooves for mechanical structures on a Si substrate at depths of equal to or greater than 100 μm.

In the above silicon etching process, a $SF_6/O_2$ gas is widely employed as an etching gas together with an oxide film mask such as a $SiO_2$ film.

However, when using the $SF_6/O_2$ gas, there occur problems that undercuts tends to be formed right under the mask and a sufficient selectivity against the oxide film mask is not obtained. To solve the problems, there has been proposed using a $SF_6/O_2/SiF_4$ gas as an etching gas (see, for example, Japanese Patent Laid-open Application No. 2004-87738 (for example, Claims): Patent Reference 1).

It is possible to prevent the undercuts and improve mask selectivity by using the $SF_6/O_2/SiF_4$ gas as an etching gas, as in the Patent Reference 1. However, it is confirmed that a number of small holes called "pits" are formed on the oxide film mask when performing the plasma etching using the above etching gas. If the pits grow during the silicon etching process and reach the silicon through the oxide film mask, various adverse effects might be caused on the semiconductor device.

FIGS. 15A to 15E illustrate cross sectional views to show a surface structure of a semiconductor wafer, and they provide schematic illustrations of a formation and a growth of pits during a silicon etching process in which a $SF_6/O_2/SiF_4$ gas is used as an etching gas. FIG. 15A shows a state where a $SiO_2$ layer 202 is formed on a silicon substrate 201, and a resist 203 is formed on the $SiO_2$ layer 202. The $SiO_2$ layer 202 is provided with an opening 210 etched according to a pattern of the resist 203. The etching of the $SiO_2$ layer is performed by using, e.g., a gas system such as $Ar/C_xF_y/O_2$ containing a fluorocarbon compound such as $C_4F_6$ and $C_5F_8$ (x and y of the $C_xF_y$ represent the stoichiometric numbers), and during the etching, reaction products such as SiO, SiOF, SiCF are generated to stick to a sidewall or a surface of the resist 203 as deposits 204.

FIG. 15B illustrates a state after removing the resist 203 by ashing, a wet processing, or the like. The deposits 204 still remain on the surface of the $SiO_2$ layer without being removed from the semiconductor wafer completely. The remaining deposits 204 then become nuclei of pits. That is, as shown in FIG. 15C, in case the etching resistance of the deposits 204 is stronger than that of the $SiO_2$ layer 202, vicinities of the deposits 204 are selectively etched during the etching process of the silicon substrate 201, whereby micro trenches 211 are formed. Since it is difficult for reaction products (deposits) of the etching to stick to the inside of the micro trenches 21 and there occurs an ion concentration to bottoms of the micro trenches 211, etching rate of the micro trenches 211 becomes higher than that of other portions of the $SiO_2$ layer 202. As a result, the depths of the micro trenches 211 increase as the silicone etching progresses, so that the micro trenches 211 grow into pits 212, as shown in FIG. 15D. If a pit 212 reaching the silicon substrate 201 is formed as shown in FIG. 15E, the reliability of the semiconductor device would be deteriorated.

Even after the resist 203 is peeled off after etching the $SiO_2$ layer 202 by using the patterned resist 203 as a mask, the deposits 204 that would become nuclei of the pits 212 remain on the $SiO_2$ layer 202, thereby forming the micro trenches 211. As a consequence, the micro trench 211 causes the pits formation. For the reason, it may be possible to prevent the formation of the micro trenches 211 and their growth into the pits 212 if the resist 203 remain as the mask until the endpoint of the silicon etching by way of setting the film thickness of the resist 203 to be sufficiently large in advance. However, if the silicon etching is performed by using only the resist 203 as the mask until the endpoint of the silicon etching, it becomes difficult to control profiles of trenches of high aspect ratios that are formed in the silicon, whereby sidewalls of the trenches become slanted, forming bowing shapes. This problem is deemed to be due to the following reason: Since the resist 203, not an oxide film ($SiO_2$ layer 202), is used as the mask, carbon of the resist reacts with and etch protection films (SiO, SiOF) of the sidewalls of the trenches. As a consequence, the silicon etching progresses in lateral directions.

SUMMARY OF THE INVENTION

It is, therefore, an object of the present invention to provide a plasma etching method capable of preventing a formation of pits while controlling etching profiles when performing a silicon etching by using a $SF_6/O_2/SiF_4$ gas as an etching gas.

In accordance with a first aspect of the present invention, there is provided a plasma etching method including: a plasma generating process of generating a plasma from a processing gas containing $SF_6$, $O_2$ and $SiF_4$ in a processing chamber of a plasma processing apparatus; a first silicon etching process of etching a target layer mainly made up of silicon by the plasma while using a resist layer, which is formed on the target layer via a silicon oxide layer, as a mask; and a second silicon etching process of etching the target layer by the plasma while using the silicon oxide layer as a mask after the resist layer is completely removed.

In the first aspect of the present invention, the deposit removing process may be performed before the silicon etching process so as to etch the target layer by the plasma generated from the processing gas containing $SF_6$, $O_2$ and $SiF_4$ while using the resist layer as a mask until the resist layer is completely removed. Alternatively, the deposit removing process may include a resist peeling process of peeling off the resist layer; and a surface etching process of etching a surface of the silicon oxide layer after the resist peeling process or may carry out the peeling of the resist layer and the removal of the deposit at the same time by a plasma of a processing gas containing $O_2$ and a fluorocarbon gas. In this case, $CF_4$ and $C_4F_8$ are preferably used as a fluorocarbon gas.

In accordance with a second aspect of the present invention, there is provided a plasma etching method including a plasma etching process of forming a recess on a target layer mainly made up of silicon by performing, in a processing chamber of a plasma processing apparatus, a plasma etching on the target layer mainly made up of silicon by using a processing gas containing $SF_6$, $O_2$ and $SiF_4$ for a plasma generation while using a silicon oxide layer formed on the target layer and a resist layer formed on the silicon oxide layer as a mask.

In the second aspect of the present invention, it is preferable that the thickness of the resist layer ranges from 300 nm to 1 μm at the time of beginning the plasma etching process. Further, it is preferable that the plasma etching is continued by using the silicon oxide layer as a mask even after the resist layer is completely removed. In this case, it is preferable that an aspect ratio D/L between a depth D and a width L of the recess is equal to or less than 1 when the resist layer is completely removed. Further, it is preferable that an aspect ratio D/L between a depth D and a width L of the recess ranges from 1 to 50 after the completing the plasma etching.

Further, it is preferable that the plasma etching process includes a first silicon etching process for etching the target layer by using the resist layer as a mask; and a second silicon etching process for etching the target layer by using the silicon oxide layer as a mask after the resist layer is completely removed. In this case, it is preferable that processing times of the first silicon etching process and the second silicon etching process are allotted so as to form the recess to have a substantially vertical sidewall to correspond to opening width of the mask.

In accordance with a third aspect of the present invention, there is provided a plasma etching method including: a plasma generating process of generating a plasma from a processing gas containing $SF_6$, $O_2$ and $SiF_4$ in a processing chamber of a plasma processing apparatus; a first silicon etching process of etching a target layer mainly made up of silicon by the plasma while using a resist layer, which is formed on the target layer via a silicon oxide layer, as a mask; and a second silicon etching process of etching the target layer by the plasma while using the silicon oxide layer as a mask after the resist layer is completely removed.

In the third aspect of the present invention, it is preferable that the thickness of the resist layer ranges from 300 nm to 1 μm at the time of beginning the plasma etching process. Further, it is preferable that an aspect ratio D/L between a depth D and a width L of a recess formed by the first silicone etching is equal to or less than 1 at the time of beginning the second silicon etching process. Further, it is preferable that an aspect ratio D/L between a depth D and a width L of the recess ranges from 1 to 50 after completing the plasma etching.

Further, in the second and the third aspect of the present invention, it is preferable that the target layer is a silicon substrate or a silicon layer.

In accordance with a fourth aspect of the present invention, there is provided a computer-executable control program, which controls, when executed, the plasma processing apparatus to perform the plasma etching method of any one of the second and the third aspect of the present invention.

In accordance with a fifth aspect of the present invention, there is provided a computer-readable storage medium for storing therein a computer executable control program, wherein, when executed, the control program controls the plasma processing apparatus to perform the plasma etching method of any one of the second and the third aspect of the present invention.

In accordance with a sixth aspect of the present invention, there is provided a plasma processing apparatus including: a processing chamber for performing a plasma etching on a target object; a support for mounting thereon the target object in the plasma processing chamber; a gas exhaust unit for depressurizing the processing chamber; a gas supply unit for supplying a processing gas into the processing chamber; and a control unit for controlling the plasma etching method of the second and the third aspect of the present invention to be carried out in the processing chamber.

In accordance with the processing method of the present invention, $SF_6/O_2/SiF_4$ is used as an etching gas and etching profiles of a recess formed in silicon can be accurately controlled while preventing pit formation. Further, by using the etching gas, occurrence of undercuts which can be formed directly beneath a mask can be suppressed and a silicon etching can be performed with a high mask selectivity. Therefore, the method can be advantageously employed in manufacturing a high reliability semiconductor device and can be applied to a field where miniaturization and high integration of semiconductor devices are required.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described in detail with reference to the accompanying drawings.

First Embodiment

Figure 1:
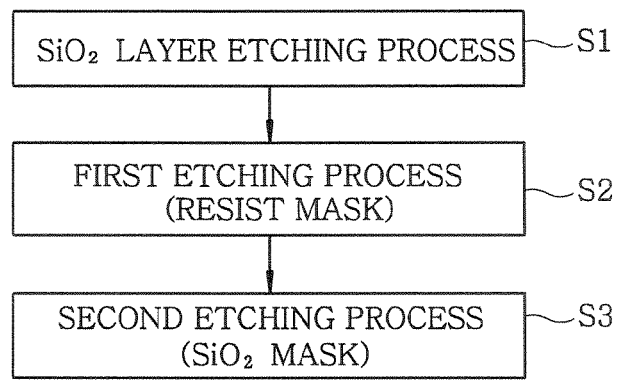
FIG. 1 provides a flow chart to describe a scheme of a processing method in accordance with a first embodiment of the present invention.
Figure 2:
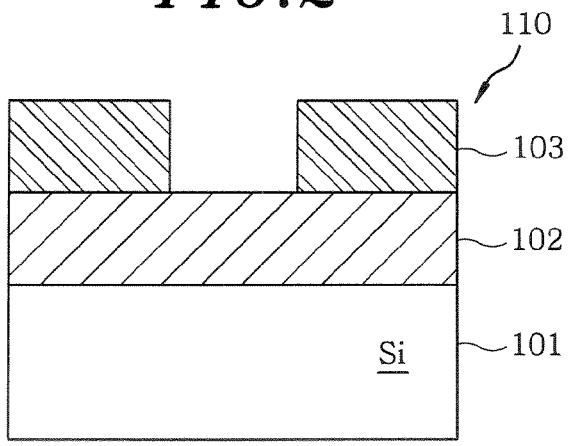
FIG. 2 sets forth a schematic cross sectional view to show a surface structure of a semiconductor wafer to which the processing method of the present invention is applied.

FIG. 1 provides a flow chart to describe a scheme of a processing method in accordance with a first embodiment of the present invention, and FIG. 2 sets forth a schematic view to show a cross sectional structure of a target object 110 such as a semiconductor wafer W to which the processing method in accordance with the first embodiment of the present invention is applied. The target object 110 includes a silicon substrate 101; a $SiO_2$ layer 102 formed on the silicon substrate 101; and a patterned resist 103 formed on the $SiO_2$ layer.

Figure 3:
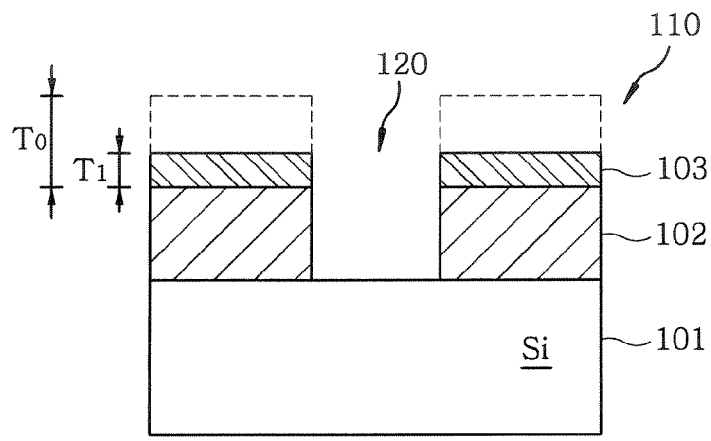
FIG. 3 illustrates a state of the semiconductor wafer after etching a $SiO_2$ layer.

As for the target object 110 in a state shown in FIG. 2, the $SiO_2$ layer 102 is first etched based on a pattern of the resist 103 by using a plasma etching apparatus 100 to be described later (Step S1). FIG. 3 illustrates a state after etching the $SiO_2$ layer 102 until a surface of the silicon substrate 101 is exposed through a pattern opening. By the etching, an opening 120 is formed in the $SiO_2$ layer, and the silicon substrate 101 is exposed at the bottom of the opening 120. Further, along with the etching of the $SiO_2$ layer 102, the resist 103 is also etched and worn from its top surface, whereby the thickness of the resist 103 is reduced from $T_0$ to $T_1$. The etching of the $SiO_2$ layer 102 can be performed by the plasma etching apparatus 100 (see FIG. 8) while using an etching gas containing a fluorocarbon compound $(C_xF_y)$, e.g., $Ar/CF_4/O_2$ or $Ar/C_4F_8/O_2$ or the like, which would hardly produce deposits.

Figure 4:
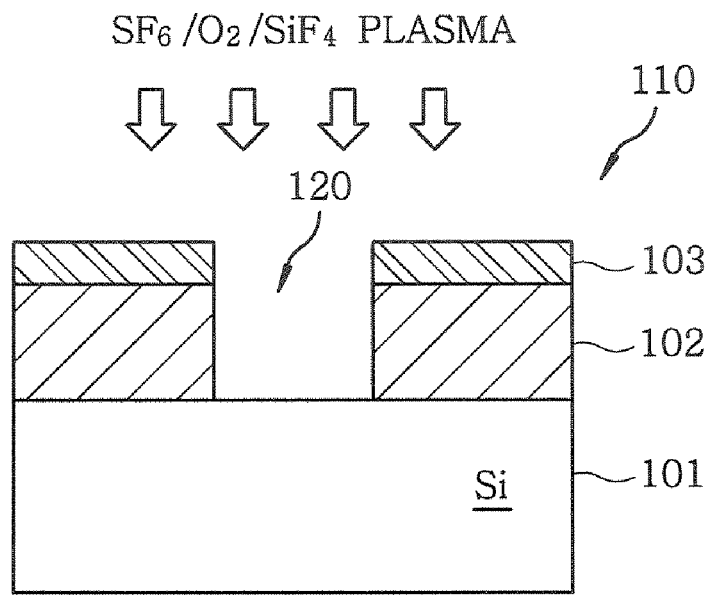
FIG. 4 shows a state of processing the semiconductor wafer in a first silicon etching process.

FIG. 4 illustrates a state in which the plasma etching apparatus 100 (see FIG. 8) performs a silicon etching on the target object 110 being in a state shown in FIG. 3 by a plasma, which is generated from a processing gas of $SF_6/O_2/SiF_4$, while using the resist 103 remaining on the $SiO_2$ layer 102 as a mask (Step S2: a first silicon etching process). Etching conditions for this process will be specified later.

Figure 5:
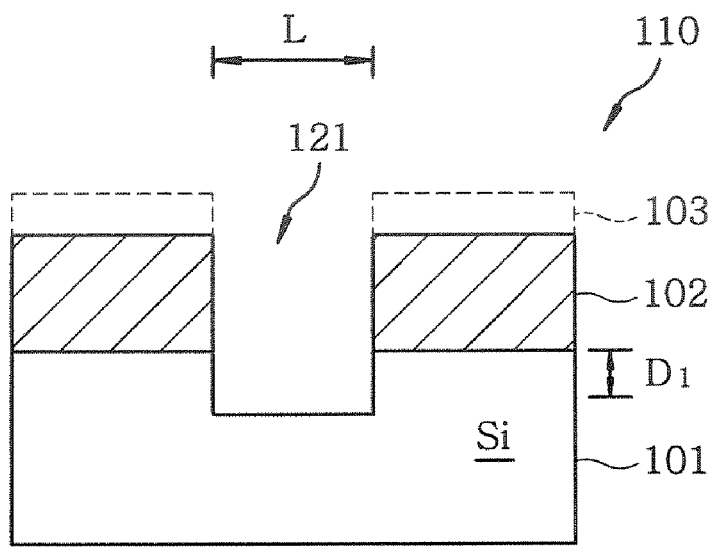
FIG. 5 illustrates a state of the semiconductor wafer after the completion of the first silicon etching process.

As a result of the silicon etching of the first silicon etching process, a recess (a trench or a hole) 121 having a depth $D_1$ and a width L corresponding to the pattern shape of the resist 103 is formed on the silicon substrate 101, as shown in FIG. 5. The first silicon etching process is performed until the resist 103 on the $SiO_2$ layer is completely etched out.

As described, by performing the silicon etching of the first silicon etching process while using the resist 103 remaining on the $SiO_2$ layer 102 as a mask, it is possible to remove deposits that would become nuclei of pits. That is, the first silicon etching process can be regarded as a process of removing the deposits. The deposits formed of reaction products generated during the etching of the $SiO_2$ layer and stuck on the resist 103 are removed during the first silicon etching process, so that the deposits are prevented from remaining on the surface of the $SiO_2$ layer 102. As a result, pit formation can be prevented.

Figure 6:
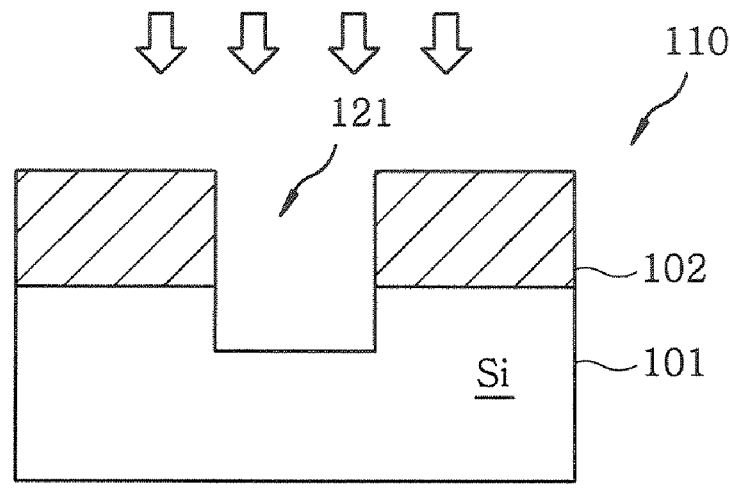
FIG. 6 shows a state of processing the semiconductor wafer in a second silicon etching process.

After the first silicon etching process, an etching of the silicon substrate 101 is continuously performed by a plasma, which is generated from a processing gas of $SF_6/O_2/SiF_4$, while utilizing the $SiO_2$ layer 102 as a mask as shown in FIG. 6 (Step S3: a second silicon etching process). Etching conditions for this process will be described later.

Figure 7:
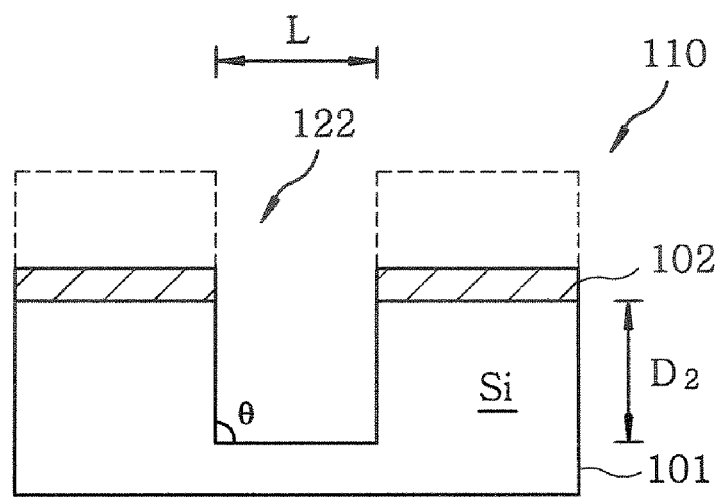
FIG. 7 illustrates a state of the semiconductor wafer after the completion of the second silicon etching process.

As a result of the second silicon etching process, a recess (a trench or a hole) 122 having a target depth $D_2$ is formed on the silicon substrate 101 as illustrated in FIG. 7. Since the deposits that would become the nuclei of the pits have been removed during the first silicon etching process (which can be also regarded as a deposit removing process), a formation of micro trenches and their growth are suppressed in the second silicon etching process. As a consequence, it is possible to prevent the pit formation.

Further, the angle formed by a sidewall of an etching groove (the recess 122) with respect to a horizontal direction $(180°-\theta$: hereinafter, referred to as a "sidewall angle") becomes approximately 90°, so that the accuracy of etching profiles is obtained.

As described above, by performing the first and the second silicon etching process successively while controlling a switching timing from the first silicon etching process to the second silicon process appropriately, the pit formation can be prevented and proper etching profiles can be obtained. Here, the switching timing from the first silicon etching process to the second silicon etching process can be controlled depending on an initial film thickness $T_0$ of the resist 103. The initial film thickness $T_0$ of the resist 103 is determined based on the following considerations.

First, the thickness $T_1$ of the resist 103 that needs to be left on the $SiO_2$ layer at the beginning of the first silicon etching process (i.e., after the completion of the etching of the $SiO_2$ layer 102) should be thick enough to allow a sufficient processing time for the first silicon etching process to remove the deposits that are stuck on the surface of the resist 103 as a result of the etching of the $SiO_2$ layer 102. Further, since a supply of carbon from the organic resist 103 is important to remove the deposits by the first silicon etching process, the resist needs to remain until the removal of the deposits is completed. In separate experiments conducted by an inventor of the present invention, it was found that the deposits can be removed by etching the resist 103 using a plasma of a $SF_6/O_2/SiF_4$ gas for a time period equivalent to that required in etching about 100 nm of the $SiO_2$ layer 102 under the same processing conditions as those for the etching of the $SiO_2$ layer. It is equivalent to about 300 nm of resist 103 considering an etching rate difference. Accordingly, the thickness $T_1$ of the resist 103 at the moment of beginning the first silicon etching process is preferably set to be, e.g., about 300 nm or greater.

Meanwhile, if the thickness $T_1$ of the resist 103 is too big, the processing time of the second silicon etching process, which is performed by using the $SiO_2$ layer 102 as a mask, would be reduced (and in the extreme, the second silicon etching process would disappears), and the etching would be performed by using the resist 103 as a mask all the time. The control of a profile of the recess 122 becomes difficult, causing the recess 122 to have a bowing shape. Thus, the thickness of the resist 103, i.e., the processing time of the first silicon etching process is preferably set to have an upper limit that falls within a range in which no adverse effect is exerted on the etching profile controllability of the final recess 122 on the silicon substrate 101. The inventor of the present invention that adverse effects on the etching profile would be hardly caused if the resist mask (the first silicon etching process) is switched to the $SiO_2$ mask (the second silicon etching process) while an aspect ratio $(D_1/L)$ of the recess 121 (see FIG. 5) formed by the etching of the first silicon etching process is equal to or less than 1.

For example, in a pattern where a width of the recess 121 is 5 μm (L=5 μm), the etching rate of silicon by the above-specified gas system is about 5 to 15 μm/min, though the etching rate can vary depending on the pattern opening ratio. Thus, in order to perform the etching up to a depth of 5 μm $(D_1=5$ μm), 20 to 60 seconds is required. Assuming that the maximum 60 seconds is required, the effect on the etching profile would be insignificant if the residual thickness of the mask is 1 μm or less when the etching rate of the resist 103 is 1 μm/min. Therefore, at the beginning of the first silicon etching process, it is preferable to set the thickness $T_1$ of the resist 103 to be, for example, 1 μm or less.

As described above, the residual thickness $T_1$ of the resist 103 required at the beginning of the first silicon etching process is preferably set to be equal to or larger than about 300 nm but equal to or smaller than 1 μm (1000 nm).

Further, the film thickness $T_0$ of the resist 103 at the beginning of the $SiO_2$ layer etching process is preferably set to allow the residual thickness $T_1$ of the resist 103 at the beginning of the first silicon etching process to be within the above-specified thickness range by considering the etching rate of the resist 103 during the $SiO_2$ layer etching process.

Figure 8:
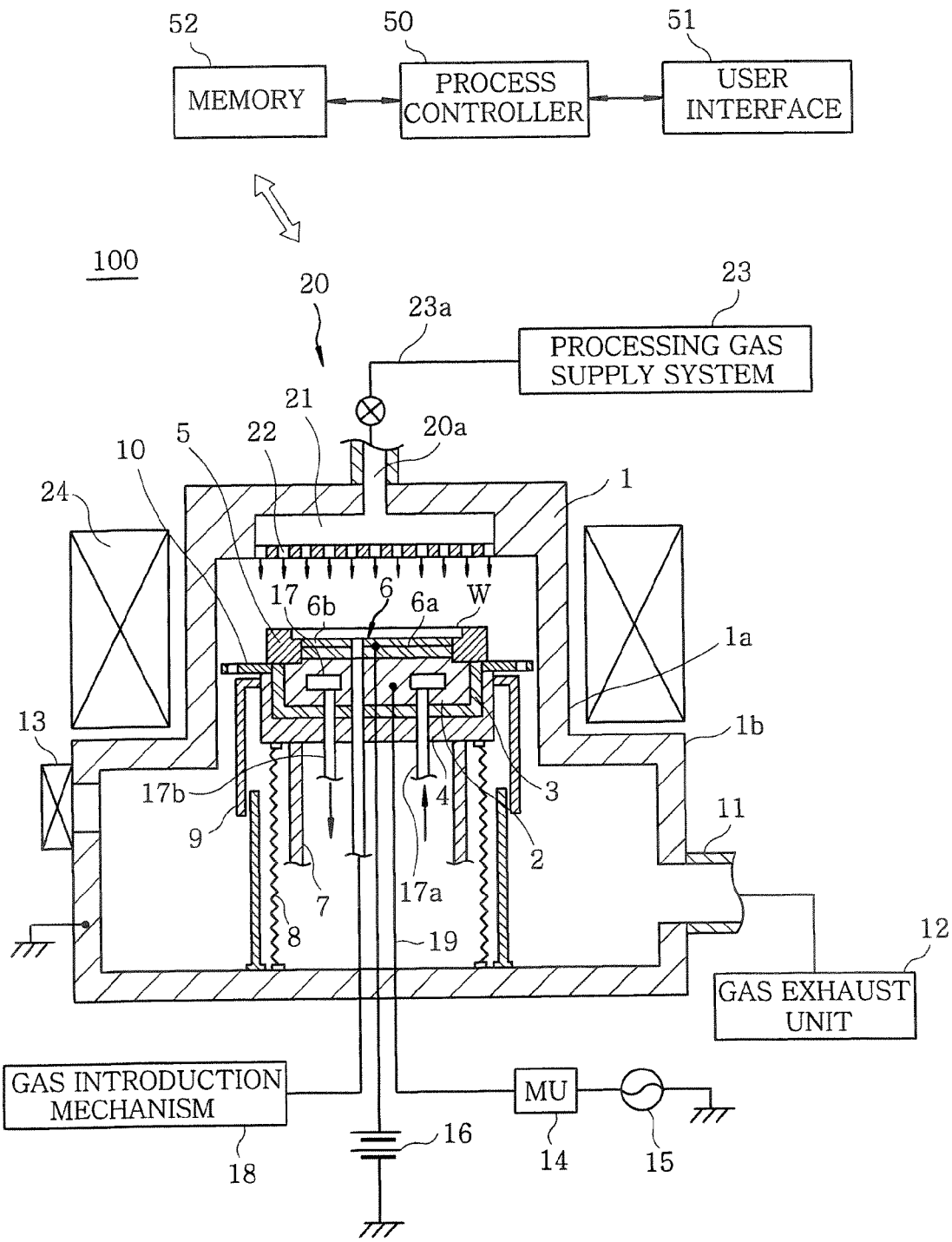
FIG. 8 presents a cross sectional view of an exemplary magnetron RIE plasma etching apparatus suitable for performing an etching method in accordance with the present invention.

Below, the first embodiment will be explained in further detail for the example of using a magnetron RIE plasma etching apparatus. FIG. 8 is a configuration view of a magnetron RIE plasma processing apparatus 100 suitable for performing a first and a second silicon etching process in accordance with the first embodiment. The plasma etching apparatus 100 includes a chamber (processing vessel) 1 having a wall made of, for example, aluminum. The chamber 1 is hermetically sealed and is configured to have a stepped cylindrical shape with an upper portion 1*a* having a smaller diameter and a lower portion 1*b* having a larger diameter.

Installed in the chamber 1 is a supporting table 2 for horizontally supporting the wafer W, the wafer W being a single crystalline silicon (Si) substrate functioning as a target object. The supporting table 2 is made of, for example, aluminum and is supported by a conductive support 4 via an insulating plate 3. Furthermore, a focus ring 5 formed of a material other than Si, for example, quartz, is provided on the periphery of the top surface of the supporting table 2. The supporting table 2 and the support 4 are configured to be moved up and down by a ball screw mechanism having ball screws 7. Further, the driving portion thereof located below the support 4 is covered with a stainless steel (SUS) bellows 8, and a bellows cover 9 is installed to enclose the bellows 8. Also, a baffle plate 10 is installed outside the focus ring 5, which is electrically connected to the chamber 1 via the baffle plate 10, the support 4 and the bellows 8. The chamber 1 is grounded.

A gas outlet port 11 is formed at a sidewall of the lower portion 1*b* of the chamber 1, and a gas exhaust system 12 is connected to the gas outlet port 11. By operating a vacuum pump of the gas exhaust system 12, the chamber 1 is depressurized to a specific vacuum level. Further, a gate valve 13 for opening and closing a loading/unloading port for the wafer W is installed at an upper sidewall of the lower portion 1*b* of the chamber 1.

A high frequency power supply 15 for plasma generation 0 is connected to the supporting table 2 via a matching unit 14, and a high frequency power of a specific frequency is applied to the supporting table 2 from the first high frequency power supply 15. Further, an electrically grounded shower head 20 to be described later in detail is disposed above the supporting table 2 while facing the supporting table 2 in parallel. Accordingly, the supporting table 2 and the shower head 20 are configured to function as a pair of electrodes.

An electrostatic chuck 6 for electrostatically attracting and holding the wafer W thereon is provided on the top surface of the supporting table 2. The electrostatic chuck 6 has an electrode 6*a* embedded in an insulator 6*b*, and the electrode 6*a* is connected to a DC power supply 16. By applying a voltage to the electrode 6*a* from the DC power supply 16, an electrostatic force, e.g., a Coulomb force, is generated, thereby attracting and holding the wafer W.

A coolant path 17 is formed inside the supporting table 2 to continuously introduce a coolant via a coolant introducing line 17*a* and discharge it via a coolant discharge line 17*b*. By the circulation of the coolant, the cold heat of the coolant is transferred from the supporting table 2 to the wafer W, whereby the processing surface of the wafer W is maintained at a desired temperature level.

Further, even while the chamber 1 is pumped by the gas exhaust system 12 to be maintained in a vacuum state, a cooling gas is introduced between the top surface of the electrostatic chuck 6 and the rear surface of the wafer W from a gas introduction mechanism 18 via a gas supply line 19 in order to effectively cool the wafer W with the coolant circulated in the coolant path 17. By introducing the cooling gas, the cold heat of the coolant is efficiently transferred to the wafer W, thereby improving the cooling efficiency for the wafer W. A He gas can be employed as the cooling gas, for example.

The shower head 20 is disposed at the ceiling portion of the chamber 1 while facing the supporting table 2. The shower head 20 is provided with a plurality of gas discharge openings 22 at its lower surface and includes a gas inlet 20*a* at the upper portion thereof. Further, the shower head 20 has a hollow space 21 formed therein. One end of a gas supply line 23*a* is connected to the gas inlet 20*a*, and the other end thereof is connected to a processing gas supply system 23 which serves to supply a processing gas containing an etching gas and a dilution gas.

The processing gas is introduced into the space 21 of the shower head 20 from the processing gas supply system 23 via the gas supply line 23*a* and the gas inlet 20*a* so as to be discharged toward the wafer W through the gas discharge openings 22.

Figure 9:
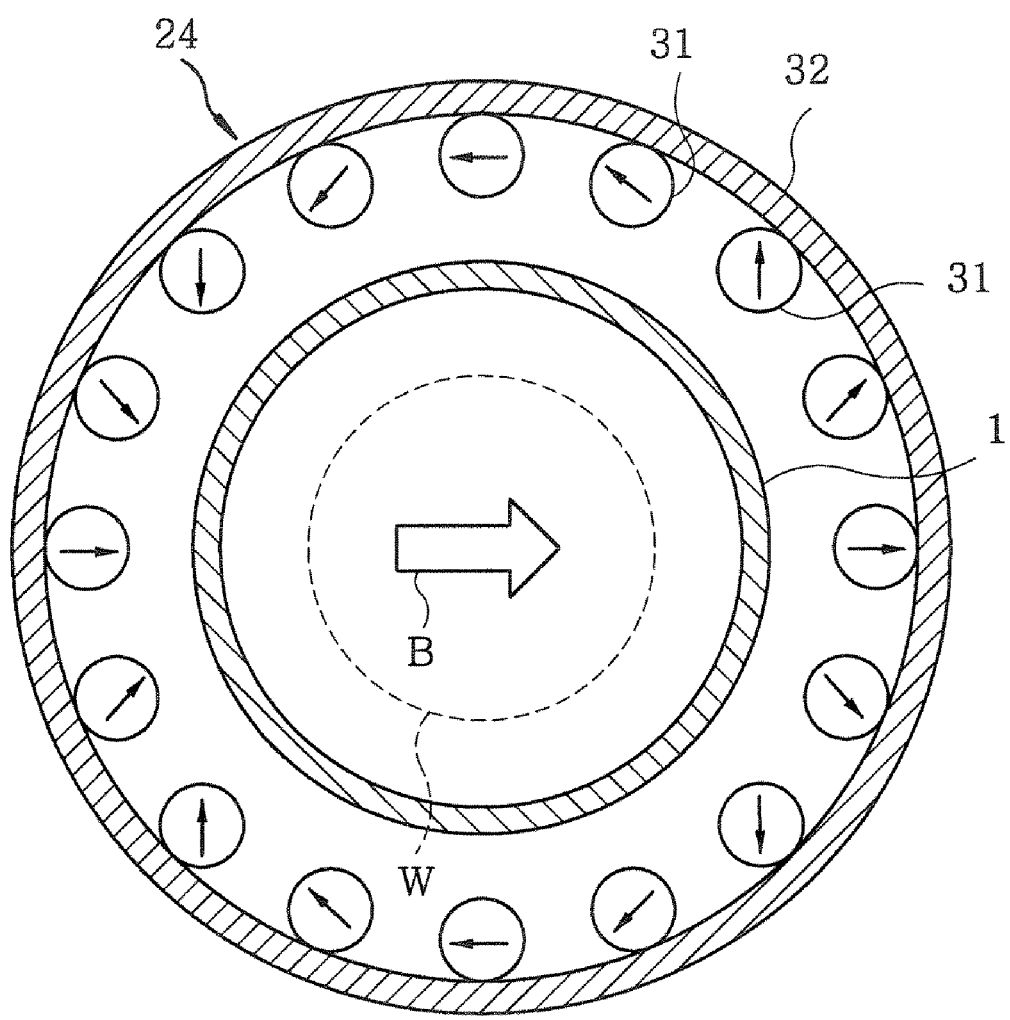
FIG. 9 sets forth a schematic horizontal cross sectional view of dipole ring magnets disposed around a processing chamber of the plasma etching apparatus shown in FIG. 8.

Meanwhile, a dipole ring magnet unit 24 is concentrically disposed around the upper portion 1*a* of the chamber 1. As illustrated in a horizontal cross sectional view of FIG. 9, the dipole ring magnet 24 is configured such that a plurality of anisotropic segment columnar magnets 31 is attached to a ring-shaped magnetic casing 32. For example, 16 of the anisotropic segment columnar magnets 31 are circumferentially disposed in a ring shape. In FIG. 9, arrows shown in the anisotropic segment columnar magnets 31 indicate magnetization directions. As shown in FIG. 9, by arranging the magnetization directions of the anisotropic segment columnar magnets 31 so that they are slightly shifted, a uniform horizontal magnetic field B is formed as a whole along a single direction.

Figure 10:
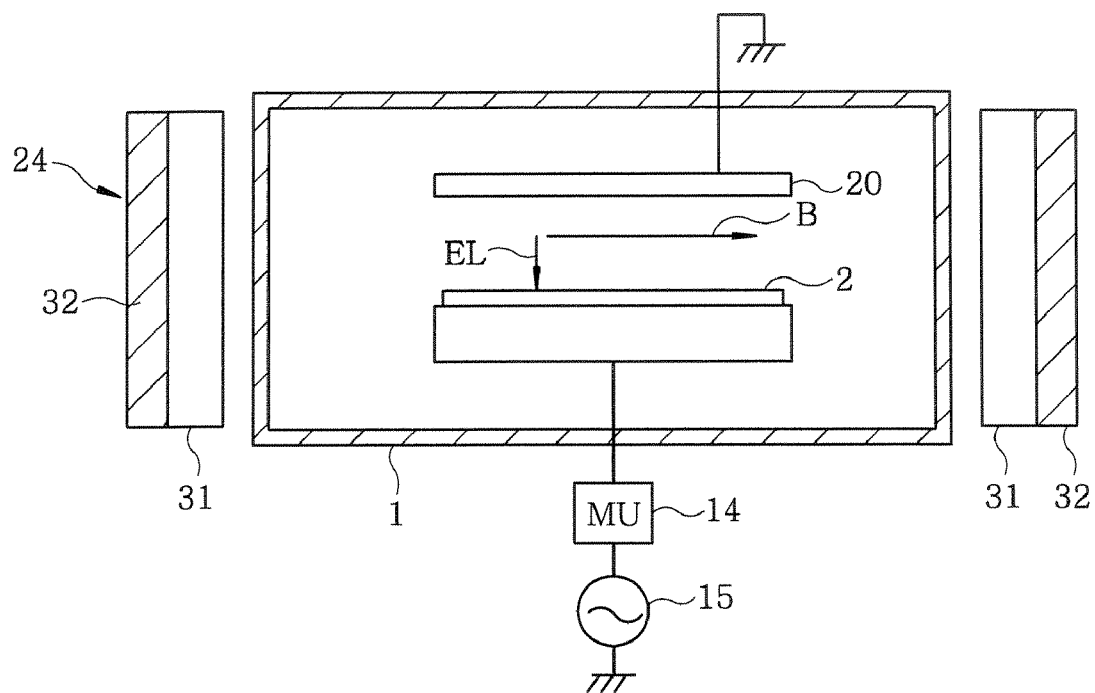
FIG. 10 depicts a schematic diagram to explain an electric field and a magnetic field formed in a processing chamber.

Therefore, as schematically shown in FIG. 10, a vertical electric field EL is formed by the electric power supply 15 and a horizontal magnetic field B is formed by the dipole ring magnet 24 in a space between the supporting table 2 and the shower head 20, which results in a formation of an orthogonal electromagnetic field. In this manner, a magnetron discharge occurs by the orthogonal electromagnetic field thus formed. Accordingly, a high-energy plasma of an etching gas is produced, which is for etching the wafer W.

Each component of the plasma etching apparatus 100 is connected to and controlled by a process controller 50 having a CPU. A user interface 51 is connected to the process controller 50, wherein the user interface 51 includes, e.g., a keyboard for a process manager to input a command to operate the plasma etching apparatus 100; a display for showing an operational status of the plasma etching apparatus 100; and the like.

Moreover, connected to the process controller 50 is a memory 52 for storing therein, e.g., control programs and recipes including processing condition data and the like to be used in realizing various processes, which are performed in the plasma etching apparatus 100 under the control of the process controller 50.

When a command is received from the user interface 51, the process controller 50 retrieves a necessary recipe from the memory 52 as required to execute the command to perform a desired process in the plasma processing apparatus 100 under the control of the process controller 50. Moreover, the necessary recipe can be retrieved from a computer-readable storage medium such as a CD-ROM, a hard disk, a flexible disk, a flash memory, or the like, or can be transmitted from another apparatus via, e.g., a dedicated line, if necessary.

The following is an explanation of an etching method of the present invention for performing a plasma etching on a silicon (a single crystalline silicon substrate or a polysilicon layer) by using the plasma etching apparatus as configured above.

First, the gate valve 13 is opened, and a wafer W is loaded into the chamber 1 to be mounted on the supporting table 2. Next, the supporting table 2 is elevated to a position illustrated in FIG. 1 and, then, an inside of the chamber 1 is exhausted through the gas outlet port 11 by a vacuum pump of the gas exhaust system 12.

A processing gas containing an etching gas and a dilution gas is supplied into the chamber 1 from the processing gas supply system 23 at a specific flow rate. Then, while maintaining the internal pressure of the chamber 1 at a specific pressure level, a specific high frequency power from the high frequency power supply 15 is supplied to the supporting table 2. At this time, the wafer W is attracted and held by, e.g., a Coulomb force generated by a specific voltage applied to the electrode 6a of the electrostatic chuck 6 from the DC power supply 16, and a high frequency electric field is formed between the shower head 20 serving as an upper electrode and the supporting table 2 serving as a lower electrode.

Since the horizontal magnetic field B has been formed by the dipole ring magnet unit 24 between the shower head 20 and the supporting table 2, the orthogonal electromagnetic field is formed in the processing space between the electrodes where the wafer W is present, and a magnetron discharge is generated due to an electron drift produced by the orthogonal electromagnetic field.

As for the etching gas, it is preferable to use a gas containing $SF_6$ and $O_2$. $SF_6$ gas is suitable for a silicon etching because a density of fluorine atoms generated from a plasma is relatively high (up to several times) compared with other fluorine-based gases and, also, a sulfur atom facilitates the etching by preventing an oxidation on an Si surface. Further, $O_2$ gas facilitates a vertical anisotropic etching by forming a silicon oxide film ($SiO_x$) on a sidewall through a reaction with silicon on a silicon substrate.

Moreover, the $SiF_4$ dissociates in the plasma to generate a gas phase Si, and thus generated Si reacts with $O_2$ molecules or oxygen radicals, whereby a silicon oxide film ($SiO_x$) is deposited on the mask ($SiO_2$ layer 102), and a sidewall protection film ($SiO_x$) is reinforced. Accordingly, a mask selectivity is improved, and a progression of a side etching is suppressed.

To improve the etching profile, it is also effective to control the temperature of the wafer W. Therefore, there is provided the coolant path 17 which circulates the coolant therethrough. In this manner, the cold heat of the coolant is transferred to the wafer W through the supporting table 2 so as to maintain the processing surface of the wafer W at a desired temperature.

The frequency and the output of the first high frequency power supply 15 for plasma generation are properly set to generate a desired plasma. To increase the density of the plasma directly above the wafer W, its frequency is preferably set to be greater than or equal to, e.g., 13.56 MHz.

To increase the plasma density right above the wafer W, the dipole ring magnet 24 forms the magnetic field in the processing space between the supporting table 2 and the shower head 20 as the facing electrodes. However, to achieve the effect of the plasma density increase, the magnet preferably has an intensity capable of forming a magnetic field of about 10000 µT (100 G) or higher in the processing space. Although the plasma density may be increased as the magnetic field becomes stronger, for safety precaution it is preferable to set the magnetic field at about 100000 µT (1 kG) or less for safety.

Further, the plasma etching apparatus 100 can also be used to etch the $SiO_2$ layer 102. In addition, though it is possible to use the plasma etching apparatus 100 to perform a plasma ashing process for removing the resist 103, the ashing process can be performed by a dedicated plasma ashing apparatus.

Desirable processing conditions for conducting the steps S1 to S3 by the plasma etching apparatus 100 are described below.

First, preferable etching conditions for the $SiO_2$ layer etching process in the step S1 are as follows. As for the processing gas, flow rates of Ar, $CF_4$ and $O_2$ are preferably set to be, e.g., about 0 to 1000 mL/min (sccm), about 1 to 100 mL/min (sccm) and about 1 to 100 mL/min (sccm), respectively. Further, a flow rate ratio therebetween, i.e., $Ar/CF_4/O_2$ is preferably set to be, e.g., about 30/1/1. A processing pressure is preferably set to be, e.g., about 1.3 to 6.7 Pa (about 10 to 50 mTorr), and the frequency and the power of the high frequency power supply 15 are preferably set to be about 13.56 MHz and 0.5 to 1 kW, respectively. The temperature of the wafer W is preferably regulated at, e.g., about 0 to 60° C.

The first silicon etching process in the step S2 and the second silicon etching process in the step S3 can be performed under the same processing conditions excepting that different etching masks are used in the two processes.

In these two silicon etching processes, it is preferable to set flow rates of $SF_6$, $O_2$ and $SiF_4$, which are used as the etching gas, to be, e.g., about 1 to 1000 mL/min (sccm), about 1 to 100 mL/min (sccm) and about 1 to 1000 mL/min (sccm), respectively. A flow rate ratio therebetween, i.e., $SF_6/O_2/SiF_4$ is preferably set to be about 1/1/2 to suppress the undercut formation.

Moreover, a processing pressure is preferably set to be about 13.3 to 133.3 Pa (about 100 to 1000 mTorr) to increase the density of etchants generated by dissociation of the etching gas.

In addition, to increase the dissociation degree of the etching gas, the frequency and the power of the high frequency power supply 15 are preferably set to be about 40 MHz and about 1 to 3 kW (for a wafer having a diameter of 200 mm), respectively.

Further, the temperature of the wafer W is preferably regulated to range from, e.g., about −15 to 30° C. to control etching profile, i.e., etching anisotropy, advantageously.

Example 1

Two Layer Etching Mask•Si Etching

By using the plasma etching apparatus 100 shown in FIG. 8, a first and a second etching process were successively performed on a target object (see FIG. 2), which has a $SiO_2$ layer 102 and a resist layer 103 on a silicon substrate 101, by using an etching gas of $SF_6/O_2/SiF_4$. The first etching process was conducted by using the resist layer 103 as a mask while the second etching process was conducted by using the $SiO_2$ layer 102 as a mask. As a result of performing the first and the second etching process, a recess 122 was formed on the silicon substrate 101.

Etching conditions therefor were as follows:
resist: thickness=1000 nm, resist material=an organic resist material containing carbon, hydrogen, and oxygen;
$SiO_2$ layer: thickness=2000 nm, a CVD oxide film;
a ratio of $SF_6/O_2/SiF_4$=150/80/400 mL/min (sccm) pressure=24 Pa (180 mTorr);
RF frequency (high frequency power supply 15)=40 MHz;
RF power=1500 W (4.77 $W/cm^2$);
back pressure (center portion/edge portion)=1333 Pa/4000 Pa (10/30 Torr; He gas);
distance between the upper and the lower electrode=37 mm;
temperature (lower electrode/upper electrode/chamber sidewall)=−10° C./60° C./60° C.; and
etching time=375 seconds (first silicon etching process=60 seconds; second silicon etching process=315 seconds).

Comparative Example 1

Oxide Single Layer Mask•Si Etching

The Comparative Example 1 was identical to the Example 1 excepting that, without using a resist mask, only a $SiO_2$ layer (having a thickness of 2000 nm) was used as a mask. As a result of the etching, a recess 122 was formed on a silicon substrate 101.

Comparative Example 2

Resist Single Layer Mask•Si Etching

By using the plasma etching apparatus 100 shown in FIG. 8, an etching was performed on a target object (see FIG. 2), which has a $SiO_2$ layer 102 and a resist layer 103 on a silicon substrate, by using an etching gas of $SF_6/O_2/SiF_4$, wherein only the resist layer 103 was utilized as a mask. As a result of the etching, a recess 122 was formed on the silicon substrate. Etching conditions therefor were as follows:
resist: thickness 5000 nm, resist material an organic resist material containing carbon, hydrogen and oxygen;
ratio of $SF_6/O_2/SiF_4$: varied as follows:
1) 300/80/0 mL/min (sccm): for 5 minutes;
2) 0/80/300 mL/min (sccm): for 5 minutes;
3) 300/80/0 mL/min (sccm): for 4.5 minutes;
pressure=13.3 Pa (100 mTorr);
RF frequency=40 MHz (high frequency power supply 15)
RF power=500 W (1.59 $W/cm^2$);
back pressure (center portion/edge portion)=2666/2666 Pa (20/20 Torr; He gas);
distance between the upper and the lower electrode=27 mm;
temperature (lower electrode/upper electrode/chamber sidewall)=−10° C./60° C./60° C.; and
etching time=900 seconds.

Table 1 shows experiment results of the Example 1 and Comparative Examples 1 and 2, i.e., Si etching depth, Si etching rate, residual thickness of mask, sidewall angle of etching groove (the recess 122) and an occurrence of pit formation. Further, the sidewall angles and the occurrence of pit formation were evaluated by images of a transmission electron microscope

TABLE 1

| Specimen | | Measured Item | Center portion | Edge portion |
|---|---|---|---|---|
| Example 1 | Resist mask + $SiO_2$ mask | Etching depth (μm) | 31.80 | 37.80 |
| | | Etching rate (μm/min) | 5.10 | 5.96 |
| | | Residual amount of mask (μm) | 1.10 | 0.79 |
| | | Sidewall angle (°) | 89.8 | 89.5 |
| | | Pit formation | Not occurred | |
| Comparative Example 1 | $SiO_2$ mask only | Etching depth (μm) | 35.80 | 38.70 |
| | | Etching rate (μm/min) | 5.73 | 6.21 |
| | | Residual amount of mask (μm) | 0.81 | 0.62 |
| | | Sidewall angle (°) | 90.0 | 89.5 |
| | | Pit formation | Occurred | |
| Comparative Example 2 | Resist mask only | Etching depth (μm) | 57.50 | 57.40 |
| | | Etching rate (μm/min) | 4.00 | 4.00 |
| | | Residual amount of mask (μm) | 1.40 | 2.31 |
| | | Sidewall angle (°) | 88.3 | 88.0 |
| | | Pit formation | Not occurred | |

As can be seen from the Table 1, in the Comparative Example 1 wherein the Si etching was conducted by using only the $SiO_2$ layer 102 as a mask (an oxide single layer mask), pits were formed though the sidewall the of recess 122 was substantially vertical with a high controllability of the etching profile. The Comparative Example 2, wherein the Si etching was conducted by using only the resist 103 as a mask (a resist single layer mask), may not be simply compared with the Example 1 and the Comparative Example 1, since its etching conditions differs from those of the Example 1 and the Comparative Example 1. However, in the Comparative Example 2, the sidewall of the recess 122 was found to be slanted to have a bowing shape, which made it impossible to control the etching profile.

In contrast, in the Example 1 (using the two layer mask) in which the first silicon etching process using the resist 103 as a mask and the second silicon etching process using the $SiO_2$ layer 102 as a mask were performed successively, the sidewall of the recess 122 was found to be substantially vertical with a high controllability of the etching profile and no pits were observed. Accordingly, it was confirmed that a prevention of pit formation and a control of etching profiles can be both achieved by performing the two-step processing that combines the silicon etching using the resist mask and the silicon etching using the $SiO_2$ mask.

Second Embodiment

Figure 11:
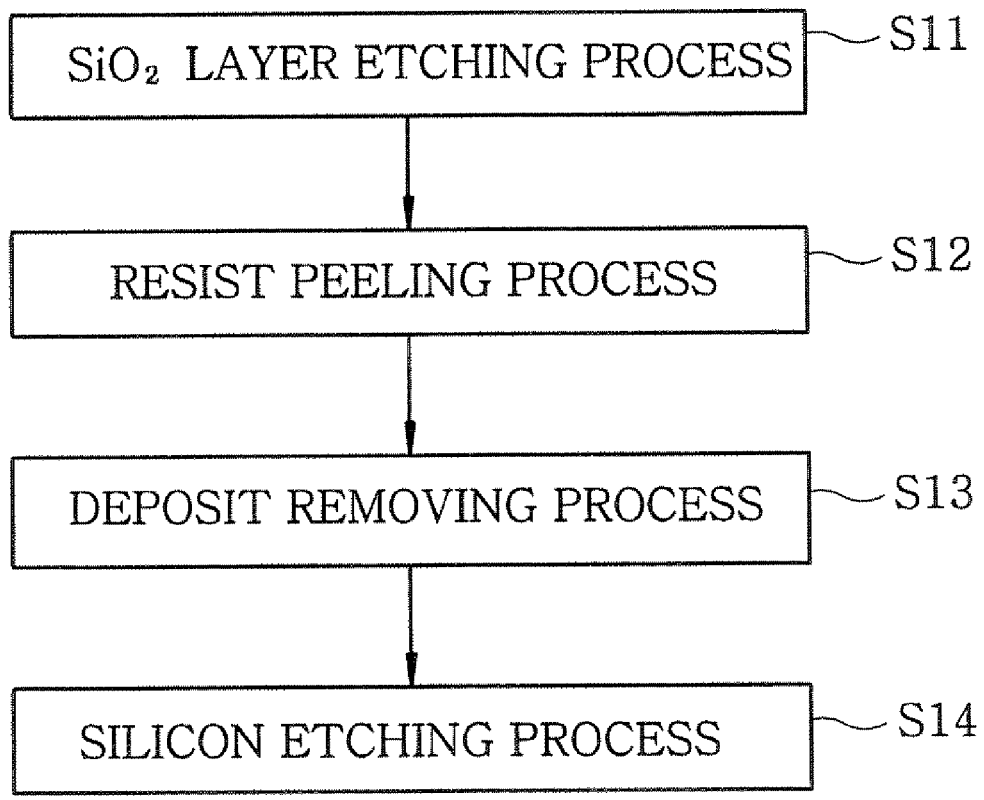
FIG. 11 provides a flow chart to describe a processing method in accordance with a second embodiment of the present invention.
Figure 12:
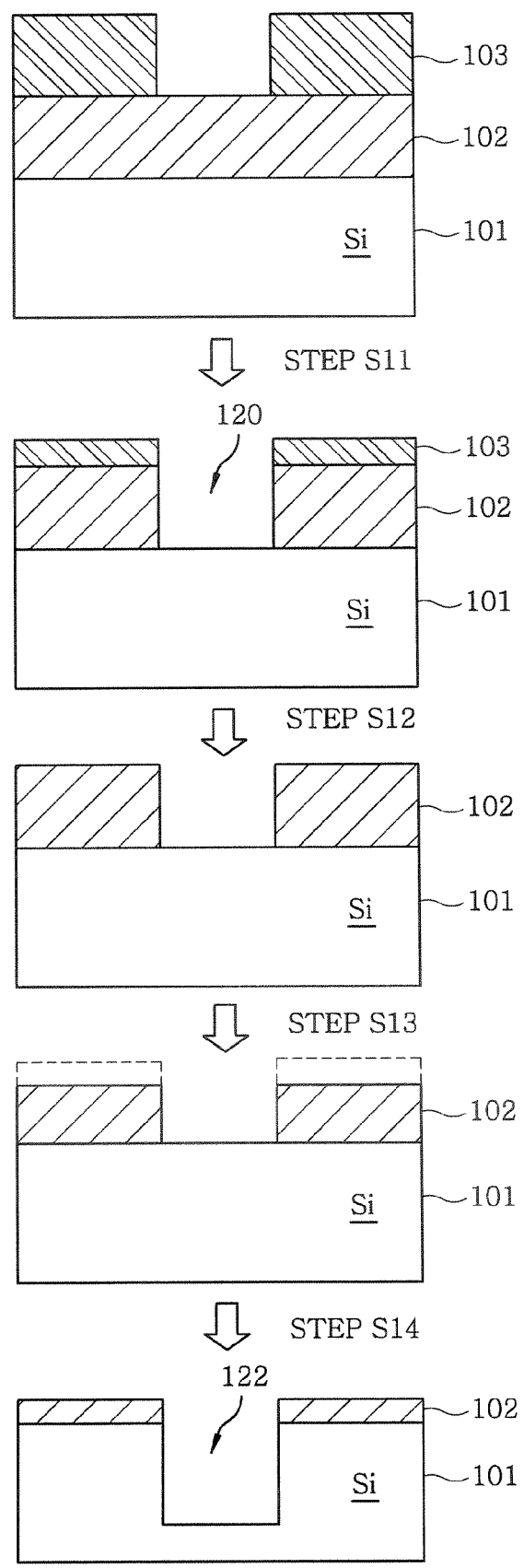
FIG. 12 set forth schematic cross sectional views to show a surface structure of a semiconductor wafer in each process of the processing method in accordance with the second embodiment of the present invention.

Next, a processing method in accordance with a second embodiment of the present invention will be described with reference to FIGS. 11 and 12. In the processing method in accordance with the above first embodiment, deposits that would become nuclei of the pits are removed by changing the etching mask from a resist 103 to a $SiO_2$ layer 102 during the silicon etching which is being performed by using the plasma of the $SF_6/O_2/SiF_4$ gas. In the second embodiment, however, a surface etching of the $SiO_2$ layer 102 is performed as a deposit removing process after a resist peeling process for peeling off the resist mask in order to remove the deposits that would become the nuclei of the pits, as shown in FIGS. 11 and 12.

First, in a step S11, the $SiO_2$ layer 102 is etched by using the resist 103 as a mask, so that a recess 120 is formed. This etching process can be performed in the same manner as that of the $SiO_2$ etching process performed in the step S1 of the processing method in accordance with the first embodiment. Therefore, description thereof will be omitted.

Then, in a step S12, the resist is peeled off. Here, various methods can be employed for the removal of the resist. For example, a wet process, a plasma ashing process using a plasma of an $O_2$ gas, and the like can be employed. When the resist is removed, the surface of the $SiO_2$ layer 102 is exposed.

After removing the resist, light etching of the surface of the $SiO_2$ layer 102 is performed in a step S13 by a plasma of an etching gas as a deposit removing process. That is, etching is performed to slightly remove the surface of the $SiO_2$ layer 102 such that the etched amount is preferably about 100 nm. Here, it is preferable to use an etching gas containing a fluorocarbon gas, such as $Ar/CF_4/O_2$ or $Ar/C_4F_8/O_2$, which would hardly produce reaction products that would become deposits.

The $SiO_2$ layer surface etching of the step S13, which is a deposit removing process, can be performed by the plasma etching apparatus 100 shown in FIG. 8 or also can be performed by a separate plasma etching apparatus. Preferable processing conditions for performing the etching of the step S13 through the use of the plasma etching apparatus 100 are as follows.

As for a processing gas, flow rates of Ar, $C_4F_8$ and $O_2$ are preferably set to be, e.g., about 0 to 1000 mL/min (sccm), about 1 to 100 mL/min (sccm) and about 1 to 100 mL/min (sccm), respectively. Further, a flow rate ratio therebetween, i.e., $Ar/C_4F_8/O_2$, is preferably set to be, e.g., about 30/1/1. A processing pressure is preferably set to be, e.g., about 1.3 to 6.7 Pa (about 10 to 50 mTorr). The frequency and the power of the high frequency power supply 15 are preferably set to be, e.g., about 13.56 MHz and 0.5 to 2 kW, respectively. The temperature of the wafer W is preferably regulated at, e.g., about 0 to 60° C.

Subsequently, in a step S14, a silicon substrate 101 is etched by a plasma generated from a processing gas of $SF_6/O_2/SiF_4$ while using the $SiO_2$ layer 102 as a mask, whereby a recess 122 is obtained. This silicon etching process can be performed in the same manner as that of the second silicon etching process performed in the step S3 of the processing method in accordance with the first embodiment. Therefore, description thereof will be omitted.

In accordance with the second embodiment as described above, it is possible to remove the deposits efficiently by way of etching the surface of the $SiO_2$ layer 102 by the plasma of the etching gas containing the fluorocarbon gas after removing the resist. Accordingly, pit formation can be prevented during the subsequent silicon etching process. Further, since the silicon etching process in the step S14 is carried out by using the $SiO_2$ layer 102 as a mask, high controllability of the etching profile can be also obtained.

Third Embodiment

Hereinafter, a processing method in accordance with a third embodiment of the present invention will be explained with reference to FIGS. 13 and 14. In the third embodiment, when performing the plasma ashing process that removes a resist mask by using a plasma, a fluorocarbon gas is added to a processing gas of the plasma ashing process in order to remove deposits that would become nuclei of pits. Therefore, an etching function is added to the processing gas of the plasma ashing and a removal of deposits is accomplished.

Figure 13:
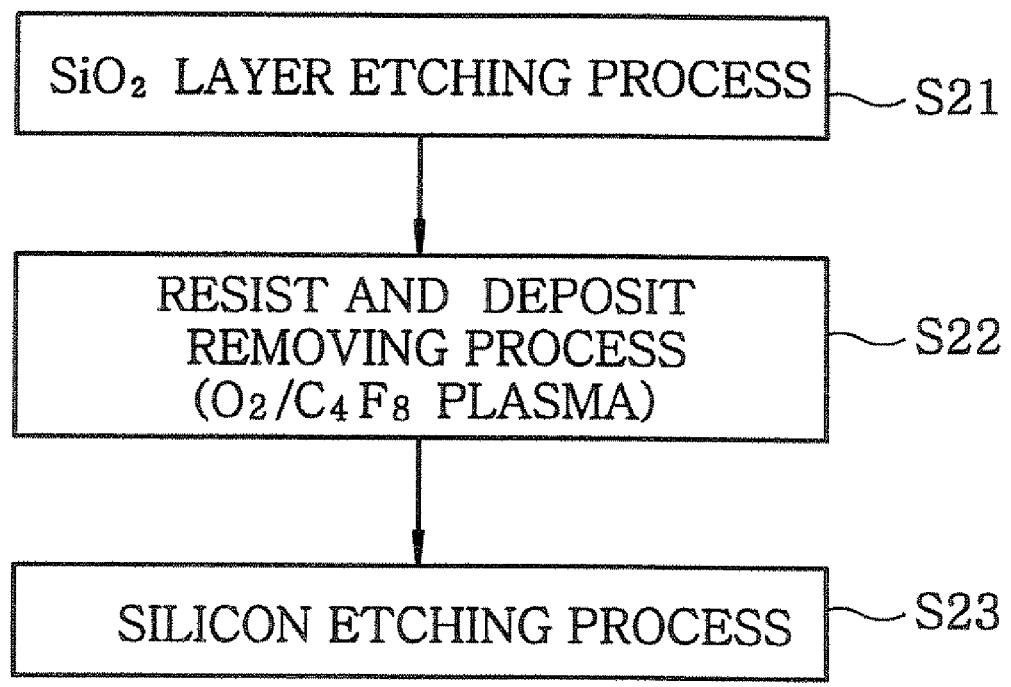
FIG. 13 offers a flow chart to describe a scheme of a processing method in accordance with a third embodiment of the present invention.
Figure 14:
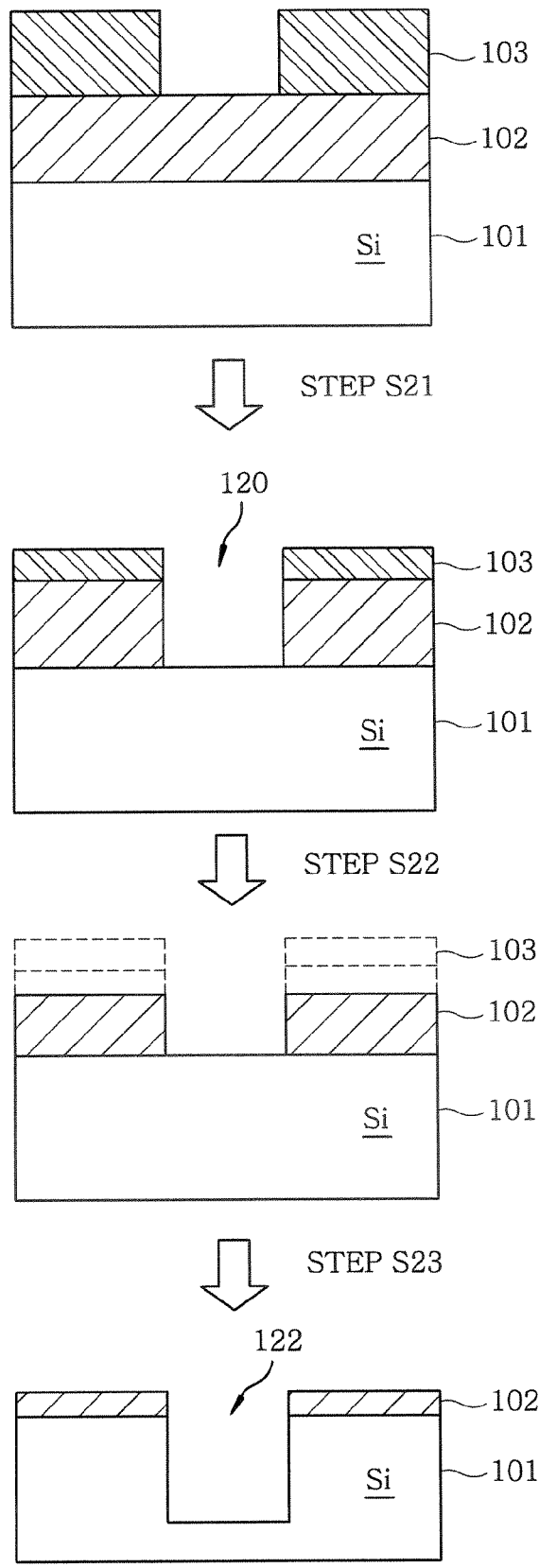
FIG. 14 depict a schematic cross sectional view to show a surface structure of a semiconductor wafer in each process of the processing method in accordance with the third embodiment of the present invention.
Figure 15A:
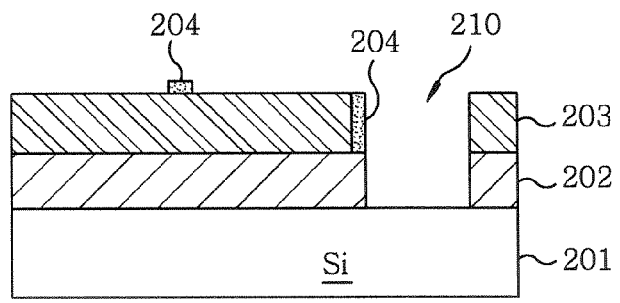
FIGS. 15A to 15E provide cross sectional views to schematically explain a conventional plasma etching method.
Figure 15B:
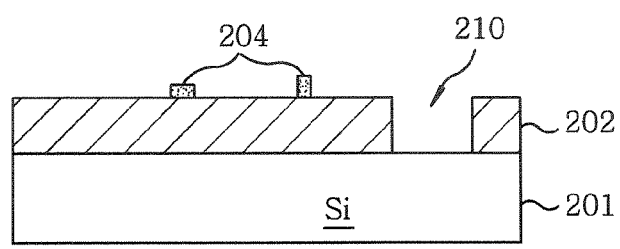
Figure 15C:
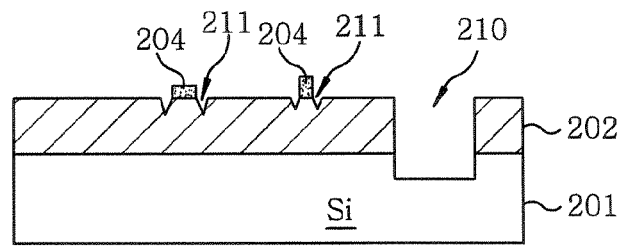
Figure 15D:
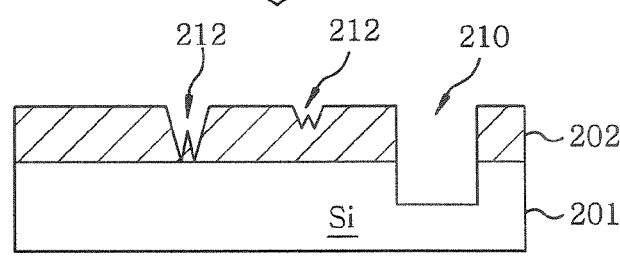
Figure 15E:
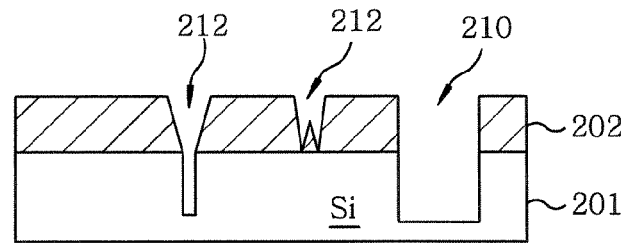

As shown in the flow chart of FIG. 13 and FIG. 14, a $SiO_2$ layer 102 is etched by using a resist 103 as a mask, so that a recess 120 is formed in a step S21. This etching process can be performed in the same manner as that of the $SiO_2$ layer etching process performed in the step S1 of the processing method in accordance with the first embodiment. Therefore, description thereof will be omitted.

Then, in a step S22, peeling of the resist and a removal of the deposits are concurrently performed by using the plasma. Specifically, by the plasma of the ashing gas, the resist 103 is peeled off and, at the same time, the surface of the $SiO_2$ layer 102 is etched slightly. In this ashing process, the etching of the $SiO_2$ layer 102 is performed after removing the resist such that the etched amount of the $SiO_2$ layer 102 is more preferably about 100 nm. Here, it is preferable to use an etching gas containing a fluorocarbon compound such as $O_2/CF_4$ or $O_2/C_4F_8$ which would hardly produce reaction products that would become deposits. Further, a rare gas such as Ar or the like can be added to the processing gas.

The plasma ashing of the step S22 for performing the peeling of the resist and the removal of the deposits at the same time can be performed by the plasma etching apparatus 100 as shown in FIG. 8 or also can be performed by a separate plasma ashing apparatus. Preferable processing conditions for performing the plasma ashing of the step S22 through the use of the plasma etching apparatus 100 are as follows.

As for a processing gas, flow rates of $O_2$ and $C_4F_8$ are preferably set to be, e.g., about 100 to 1000 mL/min (sccm) and about 1 to 50 mL/min (sccm), respectively. Further, a flow rate ratio therebetween, i.e., $O_2/C_4F_8$ is preferably set to be about 10/1. A processing pressure is preferably set to be, e.g., about 6.7 to 133.3 Pa (about 50 to 1000 mTorr). The frequency and the power of the high frequency power supply 15 are preferably set to be, e.g., about 13.56 MHz and about 0.5 to 2 kW, respectively. The temperature of the wafer W is preferably regulated at, e.g., about 0 to 60° C.

Subsequently, in a step S23, a silicon substrate 101 is etched by a plasma generated from a processing gas of $SF_6/O_2/SiF_4$ while using the $SiO_2$ layer 102 as a mask, whereby a recess 122 is formed. This silicon etching process can be performed in the same manner as that of the second silicon etching process performed in the step S3 of the processing method in accordance with the first embodiment. Therefore, description thereof will be omitted.

In accordance with the third embodiment as described above, while peeling off the resist by using the ashing gas containing the fluorocarbon gas, the surface of the $SiO_2$ layer 102 is also slightly etched concurrently by the etching function of the added fluorocarbon gas. Thus, it is possible to remove the deposits efficiently, and a pit formation can be prevented securely during the subsequent silicon etching process.

As described, in the processing methods in accordance with the first to the third embodiment of this invention, it is possible to control etching profiles appropriately while preventing the pit formation. Further, by using the $SF_6/O_2/SiF_4$ gas as an etching gas, recesses 122 (holes, trenches, or the like) having an aspect ratio ($D_2/L$) ranging from 1 to 50 can be formed in the silicon being etched with a high mask selectivity, while preventing undercuts directly beneath the mask.

Accordingly, the processing methods in accordance with the embodiments of the present invention can be properly applied to, e.g., the formation of DTI (Deep Trench Isolation) trenches for device isolation; trenches for memory cells and capacitors; trenches for interlayer contacts of a 3-dimensional package device and a MEMS (Micro Electro Mechanical System).

The present invention can be modified without being limited to the aforementioned embodiments. For example, although the dipole ring magnet is used as a magnetic field forming unit of the magnetron RIE plasma etching apparatus in the aforementioned embodiments, the magnetic field forming unit is not limited thereto and, also, it is unnecessary to form a magnetic field. As long as a plasma of the gas species of the present invention can be generated, there can be used various plasma etching apparatuses such as a capacitively coupled plasma etching apparatus, an inductively coupled plasma etching apparatus and the like.

Thus, the present invention can be advantageously applied to the manufacture of various semiconductor devices such as transistors.

While the invention has been shown and described with respect to the preferred embodiments, it will be understood by those skilled in the art that various changes and modifications may be made without departing from the scope of the invention as defined in the following claims.

What is claimed is:

1. A processing method, comprising:
a silicon oxide etching process of performing a plasma etching on a silicon oxide layer of a target object by using a patterned resist layer as a mask, wherein the target object includes an etching target layer mainly made up of silicon, the silicon oxide layer formed on the etching target layer and the patterned resist layer formed on the silicon oxide layer;
a removing process of simultaneously removing the resist layer and deposits generated in the silicon oxide etching process and stuck to the target object; and
a silicon etching process of performing a plasma etching on the etching target layer by a plasma generated from a processing gas containing sulfur hexafluoride ($SF_6$), oxygen ($O_2$) and silicon tetrafluoride ($SiF_4$) by using the silicon oxide layer as a mask,
wherein, before the silicon etching process, the removing process is performed to etch the etching target layer by the plasma generated from the processing gas containing $SF_6$, $O_2$ and $SiF_4$ by using the resist layer as a mask until the resist layer is completely removed.

2. A plasma etching method, comprising:
a plasma etching process of forming a recess on an etching target layer mainly made up of silicon by performing, in a processing chamber of a plasma processing apparatus, a plasma etching on the etching target layer by using a plasma of a processing gas containing sulfur hexafluoride ($SF_6$), oxygen ($O_2$) and silicon tetrafluoride ($SiF_4$), wherein the plasma etching is carried out by using a silicon oxide layer formed on the etching target layer and a resist layer formed on the silicon oxide layer as a mask; and
a silicon oxide etching process of etching the silicon oxide layer by using the resist layer as a mask,
wherein the plasma etching process includes:
a first silicon etching process of etching the etching target layer by using the resist layer as a mask and simultaneously removing the resist layer and deposits generated in the silicon oxide etching process; and
a second silicon etching process of etching the etching target layer by using the silicon oxide layer as a mask after the resist layer is completely removed.

3. The method of claim 2, wherein a thickness of the resist layer ranges from about 300 nm to 1 μm at the time of beginning the plasma etching process.

4. The method of claim 2, wherein the plasma etching is continuously carried out by using the silicon oxide layer as a mask even after the resist layer is completely removed.

5. The method of claim 4, wherein an aspect ratio D/L between a depth D and a width L of the recess is equal to or less than about 1 at the time when the resist layer gets completely removed.

6. The method of claim 5, wherein the aspect ratio D/L of the recess ranges from about 1 to 50 after the completion of the plasma etching process.

7. The method of claim 2, wherein processing times of the first and the second silicon etching process are allotted so as to form the recess to have a substantially vertical sidewall to correspond to an opening width of the mask.

8. A plasma etching method comprising:
a silicon oxide etching process of performing a plasma etching on a silicon oxide layer of a target object by using a resist layer as a mask, wherein the target object includes an etching target layer mainly made up of silicon, the oxide silicon layer formed on the etching target layer and the resist layer formed on the silicon oxide layer;
a plasma generating process of generating a plasma from a processing gas containing sulfur hexafluoride ($SF_6$), oxygen ($O_2$) and silicon tetrafluoride ($SiF_4$) in a processing chamber of a plasma processing apparatus;
a first silicon etching process of etching the etching target layer by the plasma, which is generated by the plasma generating process, by using the resist layer as a mask and simultaneously removing the resist layer and deposits generated in the silicon oxide etching process and stuck to the target object; and
a second silicon etching process of etching the etching target layer by the plasma, which is generated by the plasma generating process, while using the silicon oxide layer as a mask after the resist layer is completely removed.

9. The method of claim 8, wherein a thickness of the resist layer ranges from about 300 nm to 1 μm at the time of beginning the first silicon etching process.

10. The method of claim 8, wherein an aspect ratio D/L between a depth D and a width L of a recess is equal to or less than about 1 at the time of beginning the second silicon etching process.

11. The method of claim 10, wherein the aspect ratio D/L of the recess ranges from about 1 to 50 after the completion of the second silicon etching process.

12. The method of claim 8, wherein the etching target layer is a silicon substrate or a silicon layer.

* * * * *